(12) United States Patent
Ryu

(10) Patent No.: US 7,684,273 B2
(45) Date of Patent: Mar. 23, 2010

(54) SENSE AMPLIFIER BIASING METHOD AND APPARATUS

(75) Inventor: Hoon Ryu, Cary, NC (US)

(73) Assignee: Qimonda North America Corp., Cary, NC (US)

( * ) Notice: Subject to any disclaimer, the term of this patent is extended or adjusted under 35 U.S.C. 154(b) by 357 days.

(21) Appl. No.: 11/939,903

(22) Filed: Nov. 14, 2007

(65) Prior Publication Data

US 2009/0122591 A1 May 14, 2009

(51) Int. Cl.
*G11C 7/02* (2006.01)
(52) U.S. Cl. .................. 365/207; 365/205; 365/148
(58) Field of Classification Search .................. 365/207, 365/205, 148
See application file for complete search history.

(56) References Cited

U.S. PATENT DOCUMENTS

| | | | |
|---|---|---|---|
| 4,672,576 A * | 6/1987 | Davis | 365/207 |
| 5,410,197 A * | 4/1995 | Krenik | 365/205 |
| 5,526,313 A | 6/1996 | Etoh et al. | |
| 5,982,673 A | 11/1999 | Kiehl | |
| 6,191,989 B1 * | 2/2001 | Luk et al. | 365/207 |
| 6,201,728 B1 | 3/2001 | Narui et al. | |
| 6,411,543 B2 | 6/2002 | Narui et al. | |
| 6,906,972 B2 | 6/2005 | Proell et al. | |
| 7,099,216 B2 | 8/2006 | Luk et al. | |
| 7,124,240 B2 | 10/2006 | Peters | |
| 2005/0281126 A1 | 12/2005 | Kato | |
| 2006/0187720 A1 | 8/2006 | Hanzowa et al. | |
| 2007/0008811 A1 | 1/2007 | Keeth et al. | |
| 2007/0091664 A1 | 4/2007 | Chow et al. | |
| 2007/0115742 A1 | 5/2007 | Vali et al. | |

* cited by examiner

*Primary Examiner*—Tuan T. Nguyen
(74) *Attorney, Agent, or Firm*—Coats & Bennett, P.L.L.C.

(57) ABSTRACT

A memory device includes sense amplifier circuitry, a current sink and a resistive element. The sense amplifier circuitry is operable to evaluate data read from a memory array included in the memory device responsive to a bias voltage applied to the sense amplifier circuitry. The current sink is operable to sink a bias current. The resistive element couples the current sink to the sense amplifier circuitry. The bias voltage applied to the sense amplifier circuitry corresponds to the voltage drop across the resistive element and current sink as induced by the bias current.

22 Claims, 3 Drawing Sheets

SENSE AMPLIFIER BIASING METHOD AND APPARATUS

BACKGROUND OF THE INVENTION

Many types of memory devices such as Dynamic Random Access Memory (DRAM) devices store information in memory cells arranged as one or more arrays of selectable rows and columns. Lines connecting each row are commonly referred to as word lines. Each column typically comprises two bit lines, each bit line connected to every other memory cell in the column. To accommodate high density memory demands, two levels of sense amplifier circuitry are typically used to read data out of a memory array and off chip. Primary Sense Amplifier (PSA) circuitry directly reads data from an activated row in the array and drives the data onto a local data bus. Secondary Sense Amplifier (SSA) circuitry coupled to the local data bus evaluates the data by sensing voltage levels of the local data bus and driving the sensed data onto a global data bus. The desired data is then driven off chip.

Conventional SSA circuitry typically comprises pairs of cross-coupled differential amplifiers coupled to current source transistors. Each pair of cross-coupled amplifiers senses the voltage difference between its pair of complementary data bus lines when activated during a read operation. The cross-coupled differential amplifiers cannot reliably sense the voltage difference unless provided sufficient current. To this end, each amplifier is coupled to a current source transistor that enables current flow within the SSA circuitry. Sufficient current flows in the differential amplifier circuitry only when all current source transistors are properly biased. If even a single current source transistor is improperly biased, the SSA circuitry functions unreliably.

A single bias circuit is typically provided for biasing all current source transistors included in the SSA circuitry. Consider, for example, a memory device having two 128-bit wide memory arrays. Each memory array has SSA circuitry coupled thereto. Each set of SSA circuitry has 128 pairs of cross-coupled differential amplifiers and 256 current source transistors for providing current to respective ones of the differential amplifiers. The same circuit biases all 512 current source transistors. However, process variation ensures that all current source transistors will not have the same operating characteristics such as threshold voltage. Instead, a distribution of threshold voltages governs operation of the current source transistors.

The SSA circuitry will not function properly unless the current source transistors with a high threshold voltage are biased properly. Conventionally, the operating margin of the bias circuit is set based on a distribution of expected threshold voltages for the current source transistors. The suitability of the memory device for low power applications and applications having stringent temperature requirements suffers when the bias circuit must draw current high enough to ensure proper biasing of the SSA circuitry. Moreover, the SSA circuitry still functions improperly when the actual distribution of actual threshold voltages falls outside the modeled range because operation of conventional SSA bias circuits cannot be adjusted to account for unexpected results.

SUMMARY OF THE INVENTION

A memory device comprises sense amplifier circuitry, a current sink and a resistive element. The sense amplifier circuitry is operable to evaluate data read from a memory array included in the memory device responsive to a bias voltage applied to the sense amplifier circuitry. The current sink is operable to sink a bias current. The resistive element couples the current sink to the sense amplifier circuitry. The bias voltage applied to the sense amplifier circuitry corresponds to the voltage drop across the resistive element and current sink as induced by the bias current.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
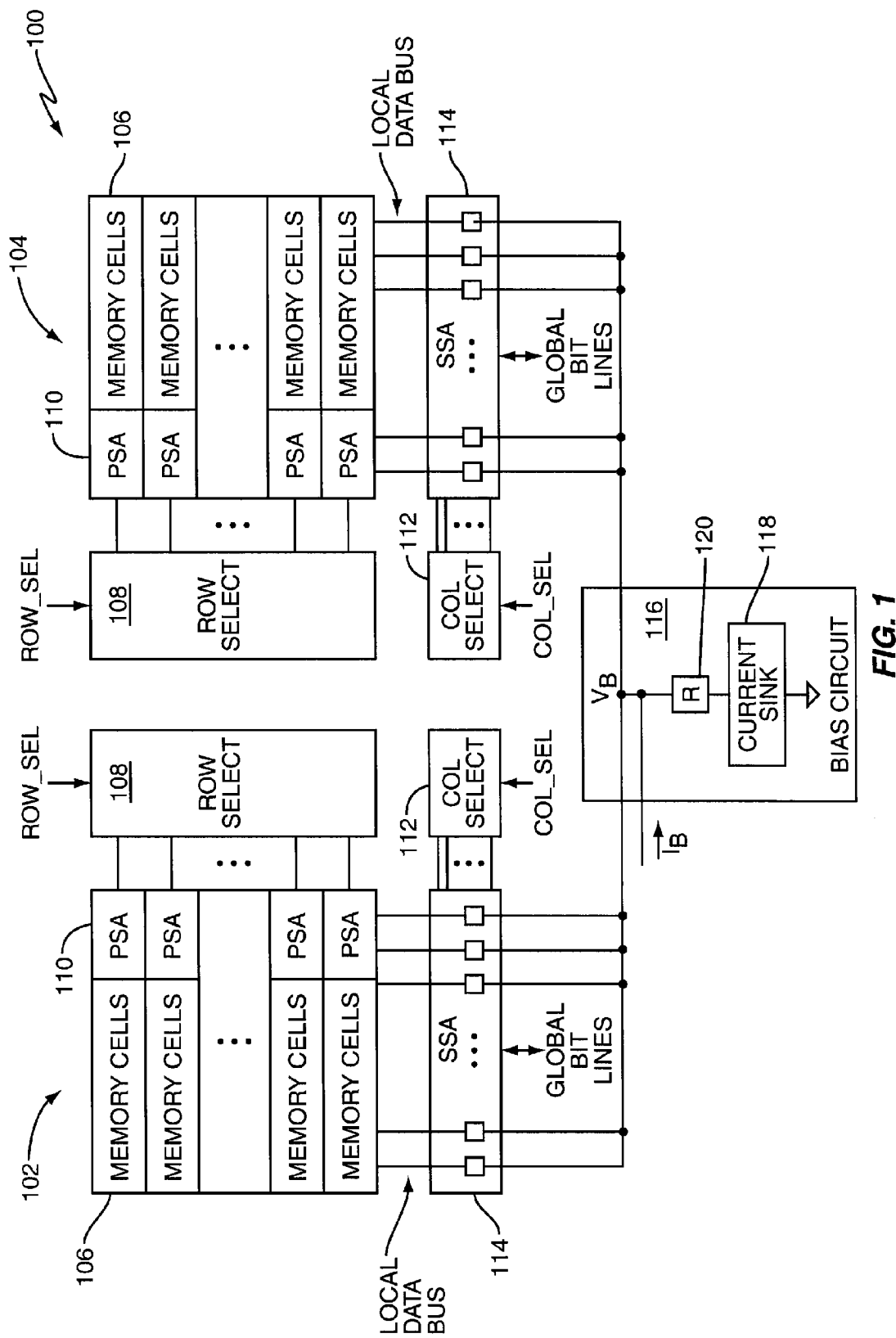
FIG. 1 is a block diagram of an embodiment of a memory device including sense amplifier biasing circuitry.

FIG. 1 illustrates an embodiment of a memory device 100 including two memory arrays 102, 104. In other embodiments, the memory device 100 may include more or less memory arrays. Regardless, each memory array 102, 104 is arranged as one or more logical banks of memory cells 106 such as Dynamic RAM (DRAM), Ferroelectric RAM (FRAM), Magnetoresistive RAM (MRAM), Phase-change RAM (PRAM) or similar types of cells. Row, column and bank address information received by the memory device 100 indicates which memory array row and column location is to be accessed during memory operations (and bank if the arrays are so arranged).

During read operations, decoded row address information (ROW_SEL) is provided to row select circuitry 108 coupled to the memory arrays 102, 104. The decoded row address information indicates which row of memory cells 106 within one or both of the arrays 102, 104 is to be activated during a read operation. Primary Sense Amplifier (PSA) circuitry 110 located near the row of activated memory cells 106 senses the state of each activated cell as is well known in the art. The PSA circuitry 110 drives a local data bus with the sensed data. Decoded column address information (COL_SEL) is provided to column select circuitry 112. In response, the column select circuitry 112 determines which columns of memory array data sensed by the PSA circuitry 110 are to be evaluated by Secondary Sense Amplifier (SSA) circuitry 114. The SSA circuitry 114 is coupled to the local data bus and evaluates memory array data read by the PSA circuitry 110. The SSA circuitry 114 evaluates the local data bus by sensing voltage levels of complementary local data bus lines and driving a global data bus with the sensed data. The sensed data is then driven off-chip as is well known in the art.

In more detail, the SSA circuitry 114 includes a pair of cross-coupled differential amplifiers (not shown) coupled to each complimentary pair of local data bus lines and a current source transistor (also not shown) coupled to each differential amplifier. Together, the pairs of cross-coupled differential amplifiers evaluate the local data bus lines during read operations. The current source transistors provide current to respective ones of the differential amplifiers when properly biased. A central bias circuit 116 ensures that the SSA circuitry 114 is properly biased when evaluating data read from the memory arrays 102, 104 by the PSA circuitry 110.

The bias circuit 116 includes a current sink 118 and a resistive element 120. The resistive element 120 couples the current sink 118 to the SSA circuitry 114. The current sink 118 sinks a bias current ($I_B$) flowing through the resistive element 120. Accordingly, the bias current induces a voltage drop ($V_B$) across the resistive element 120 and current sink 118 which is applied to the SSA circuitry 114. The voltage drop is given by:

$$V_B = V_{CS} + I_B R \quad (1)$$

where the first term represents the voltage drop across the current sink 118 and the second term represents the voltage drop across the resistive element 120. Absent the resistive element 120, the bias current would have to be increased to ensure that all current source transistors included in the SSA circuitry 114 having a high threshold voltage are properly biased. Otherwise, the SSA circuitry 114 would function improperly.

Coupling the resistive element 120 between the current sink 118 and the SSA circuitry 114 as shown in FIG. 1 obviates the need to increase the operating margin of the current sink 118. Instead, the additional voltage drop across the resistive element 120 increases the voltage bias applied to the SSA circuitry 114. By selecting an appropriate resistance for the resistive element 120, all current source transistors included in the SSA circuitry 114 will function properly without having to increase the bias current.

The resistance of the resistive element 120 is selected so that the bias voltage given by equation (1) is sufficient to bias even the current source transistors included in the SSA circuitry 114 having high threshold voltages. This reduces power consumption by the memory device 100 while ensuring proper operation of the SSA circuitry 114, which is desired for low power applications. Moreover, the resistance of the resistive element 120 may be fixed or variable. When the resistance of the resistive element 120 is variable, the bias voltage applied to the SSA circuitry 114 can be adjusted upward or downward based on actual threshold voltage conditions by altering the resistance.

In one embodiment, process variations are modeled to determine a distribution of expected threshold voltages for the current source transistors included in the SSA circuitry 114. A fixed resistance is then selected for the resistive element 120 which yields a sufficient bias voltage for all SSA current source transistors. In another embodiment, the resistance of the resistive element is variable so that it can be altered after the memory device 100 has been fabricated. This way, the effect actual process variations have on threshold voltage can be measured and the resistance adjusted accordingly. Either way, coupling the resistive element 120 between the current sink 118 and the SSA circuitry 114 enables proper biasing of the SSA circuitry 114 without having to unduly compensate the operating margin of the current sink 118.

Figure 2:
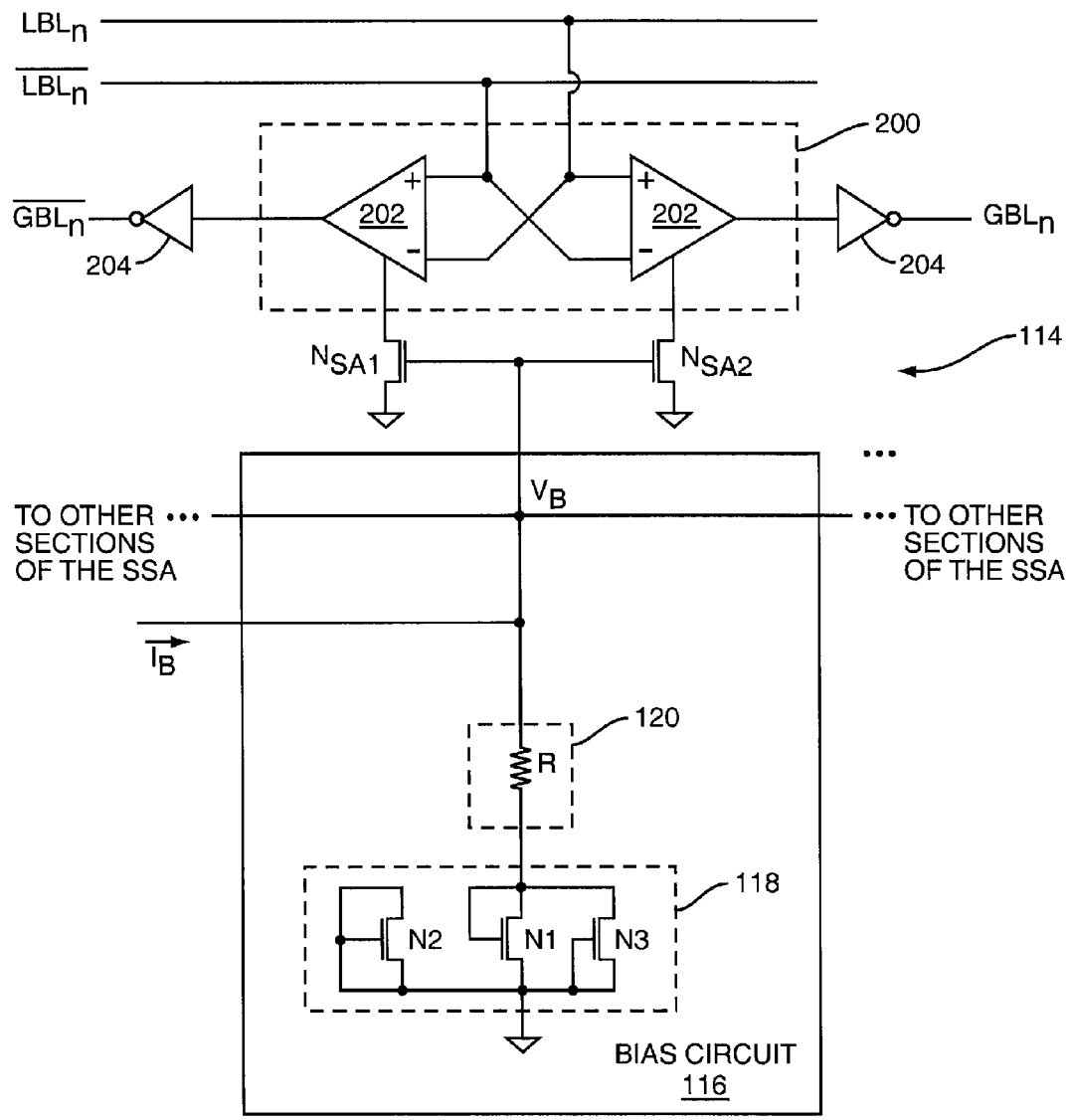
FIG. 2 is a block diagram of an embodiment of biasing circuitry coupled to sense amplifier circuitry in a memory device.

FIG. 2 illustrates one embodiment of the bias circuit 116 coupled to a section of the SSA circuitry 114. According to this embodiment, the bias circuit current sink 118 includes an n-fet transistor N1 arranged in a diode-like configuration. Particularly, the source of n-fet transistor N1 is coupled to ground. The gate is coupled to the drain. The drain is also coupled to one terminal of the resistive element 120 which is a fixed resistor (R) in this embodiment, e.g., a region of polysilicon. The other terminal of the resistive element 120 is coupled to the gate of each current source transistor $N_{SA1}$ to $N_{SAn}$ included in or associated with the SSA circuitry 114. According to this embodiment, the bias voltage $V_B$ applied to the current source transistors $N_{SA1}$ to $N_{SAn}$ is given by:

$$V_B = \left(\sqrt{\frac{2I_B}{\beta}}\right) + V_{tN1} + I_B R \quad (2)$$

where $\beta$ is the gain factor of n-fet N1 and $V_{tN1}$ is the threshold voltage of n-fet N1. An optional n-fet transistor N2 may be included in the bias circuit current sink 118 for increasing the bias voltage by an amount corresponding to the gain factor of n-fet N2, the drain-to-source current flowing through n-fet N2 and the threshold voltage of n-fet N2. A second optional transistor N3 may also be included in the bias circuit current sink 118 for layout purposes only. That is, the gate of n-fet N3 is tied to ground so that n-fet N3 is turned off, but forms a "dummy" transistor that reduces layout-related irregularities. The n-fet transistors N1, N2 and N3 and the SSA current source transistors $N_{SA1}$ to $N_{San}$ may have a low or negligible threshold voltage, i.e., they are low threshold voltage transistors. Alternatively, n-fet transistors N1, N2 and N3 and the SSA current source transistors $N_{SA1}$ to $N_{San}$ may have a standard or normal threshold voltage.

Regardless, the resulting bias voltage $V_B$ is applied to the gate of each current source transistor $N_{SA1}$ to $N_{San}$ included in the SSA circuitry 114. The resistive element 120 enables the bias voltage to be increased without increasing the bias current $I_B$ when n-fet N1 is properly sized. This way, each current source transistor $N_{SA1}$ to $N_{San}$ is properly biased without consuming additional power. The current source transistors $N_{SA1}$ to $N_{San}$ provide sufficient current to differential amplifier circuitry 200 included in the SSA circuitry 114 when properly biased.

In one embodiment, the differential amplifier circuitry 200 includes pairs of cross-coupled differential amplifiers 202. Each pair of differential amplifiers 202 is cross-coupled to respective complimentary local data bus lines, e.g., LBLn and $\overline{\text{LBLn}}$ in FIG. 2. The differential amplifier circuitry 200 reliably evaluates the voltage levels present on the local data bus when sufficient current flows in the amplifier circuitry 200. After sensing the voltage difference between complimentary local data bus lines, buffer circuitry 204 drives the differential amplifier output onto respective complimentary global data bus lines, e.g., GBLn and $\overline{\text{GBLn}}$ in FIG. 2. The sensed data can then be driven off-chip.

Figure 3:
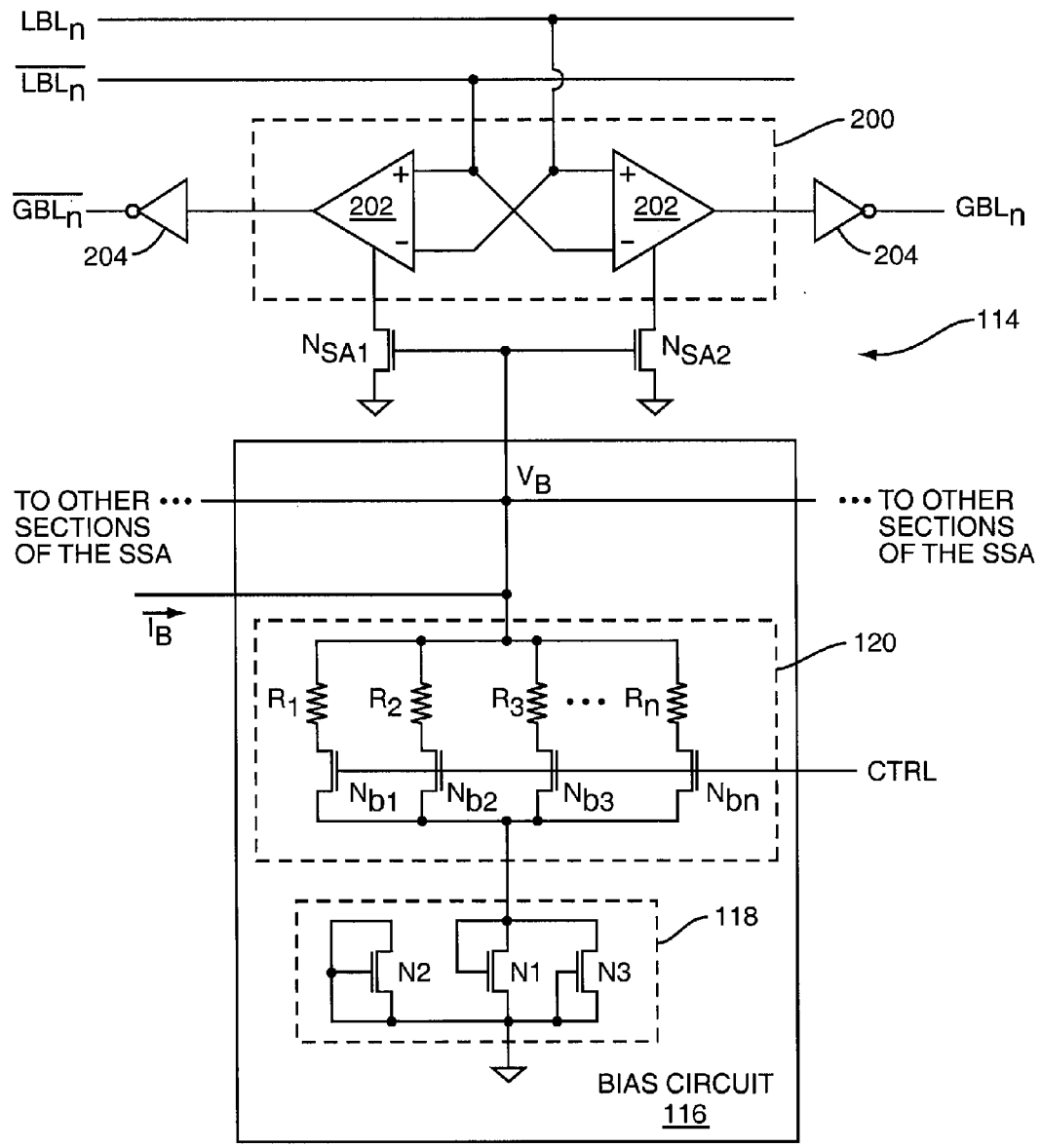
FIG. 3 is a block diagram of another embodiment of biasing circuitry coupled to sense amplifier circuitry in a memory device.

FIG. 3 illustrates another embodiment of the bias circuit 116 coupled to a section of the SSA circuitry 114. According to this embodiment, the resistance of the resistive element 120 is variable. A plurality of switches Nb1 to Nbn are each coupled in series with a respective resistor R1 to Rn. Any resistor may be switched into the resistive network 120 by activating the corresponding switch using a control signal (CTRL). Likewise, a resistor may be switched out of the network 120 by deactivating the corresponding switch.

The bias voltage applied to the SSA current source transistors $N_{SA1}$ to $N_{San}$ can be readily adjusted to account for unexpected threshold voltage variations by altering the resistance of the resistive element 120. Instead of selecting a fixed resistance based on the modeled effect process variation has on threshold voltage, the actual effect of process variation can be determined after the memory device 100 is fabricated, e.g., by testing device operation. This way, a more accurate understanding of the operating characteristics of the SSA circuitry 114 can be determined and compensated for. If one or more of the SSA current source transistors $N_{SA1}$ to $N_{San}$ has a threshold voltage higher than expected, the resistance of the resistive element 120 can be increased by a corresponding amount to ensure proper voltage biasing of the SSA circuitry 114. Likewise, the resistance may be lowered if the threshold voltages are lower than expected to reduce the amount of heat dissipated by the resistive element 120.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A memory device, comprising:
   sense amplifier circuitry operable to evaluate data read from a memory array included in the memory device responsive to a bias voltage applied to the sense amplifier circuitry;
   a current sink operable to sink a bias current; and
   a resistive element coupling the current sink to the sense amplifier circuitry, wherein the bias voltage applied to the sense amplifier circuitry corresponds to the voltage drop across the resistive element and current sink as induced by the bias current.

2. The memory device of claim 1, wherein the sense amplifier circuitry comprises differential amplifier circuitry and a plurality of current source transistors operable to provide current to the differential amplifier circuitry responsive to the bias voltage and wherein one terminal of the resistive element is coupled to the gate of each current source transistor and the other terminal of the resistive element is coupled to the current sink.

3. The memory device of claim 2, wherein the current source transistors and the current sink comprise low threshold voltage transistors.

4. The memory device of claim 2, wherein the current sink comprises an n-fet transistor having a source coupled to ground, a gate coupled to a drain and the drain coupled to one terminal of the resistive element and wherein the other terminal of the resistive element is coupled to the gate of each current source transistor.

5. The memory device of claim 1, wherein the resistance of the resistive element is fixed.

6. The memory device of claim 1, wherein the resistance of the resistive element is variable.

7. A method of operating a memory device, comprising:
   evaluating data read from a memory array responsive to a bias voltage applied to sense amplifier circuitry included in the memory device;
   passing a bias current through a resistive element coupled to the sense amplifier circuitry; and
   setting the bias voltage applied to the sense amplifier circuitry based on the magnitude of bias current flowing through the resistive element and the resistance of the resistive element.

8. The method of claim 7, wherein setting the bias voltage applied to the sense amplifier circuitry comprises selecting the resistance of the resistive element so that each current source transistor included in the sense amplifier circuitry is properly biased.

9. The method of claim 8, wherein setting the bias voltage applied to the sense amplifier circuitry comprises:
   coupling the source of an n-fet transistor to ground;
   coupling the gate of the n-fet transistor to the drain of the n-fet transistor;
   coupling the drain of the n-fet transistor to one terminal of the resistive element; and
   coupling the other terminal of the resistive element to the gate of each current source transistor.

10. The method of claim 7, wherein passing the bias current through the resistive element comprises passing the bias current through a resistive element having a fixed resistance.

11. The method of claim 7, wherein passing the bias current through the resistive element comprises passing the bias current through a resistive element having a variable resistance.

12. The method of claim 7, further comprising altering the resistance of the resistive element to adjust the bias voltage applied to the sense amplifier circuitry.

13. A memory device, comprising:
   differential amplifier circuitry operable to evaluate data read from a memory array included in the memory device;
   a plurality of current source transistors operable to provide current to the differential amplifier circuitry responsive to a bias voltage applied to the gate of each current source transistor;
   a current sink operable to sink a bias current; and
   a resistive element coupling the current sink to the gate of each current source transistor, wherein the bias voltage applied to the gate of each current source transistor corresponds to the voltage drop across the resistive element and current sink as induced by the bias current.

14. The memory device of claim 13, wherein the current source transistors and the current sink comprise low threshold voltage transistors.

15. The memory device of claim 13, wherein the current sink comprises an n-fet transistor having a source coupled to ground, a gate coupled to a drain and the drain coupled to one terminal of the resistive element and wherein the other terminal of the resistive element is coupled to the gate of each current source transistor.

16. The memory device of claim 13, wherein the resistance of the resistive element is fixed.

17. The memory device of claim 13, wherein the resistance of the resistive element is variable.

18. A method of operating a memory device, comprising:
   providing current to differential amplifier circuitry operable to evaluate data read from a memory array, wherein the current is provided by a plurality of current source transistors responsive to a bias voltage applied to the gate of each current source transistor;
   passing a bias current through a resistive element coupled to the gate of each current source transistor; and
   setting the bias voltage applied to the gate of each current source transistor based on the voltage drop across the resistive element and a current sink as induced by the bias current.

19. The method of claim 18, wherein setting the bias voltage applied to the gate of each current source transistor comprises:
   coupling the source of an n-fet transistor to ground;
   coupling the gate of the n-fet transistor to the drain of the n-fet transistor;
   coupling the drain of the n-fet transistor to one terminal of the resistive element; and
   coupling the other terminal of the resistive element to the gate of each current source transistor.

20. The method of claim 18, wherein passing the bias current through the resistive element comprises passing the bias current through a resistive element having a fixed resistance.

21. The method of claim 18, wherein passing the bias current through the resistive element comprises passing the bias current through a resistive element having a variable resistance.

22. The method of claim 18, further comprising altering the resistance of the resistive element to adjust the bias voltage applied to the gate of each current source transistor.

* * * * *